(12) United States Patent
Manchester et al.

(10) Patent No.: US 6,481,449 B1
(45) Date of Patent: Nov. 19, 2002

(54) ULTRASONIC METAL FINISHING

(75) Inventors: Russell Manchester, Waconia, MN (US); Kenneth E. Pfeiffer, Round Rock, TX (US); Don Titel, Liberty Hill, TX (US); Wayne W. Wheatley, Austin, TX (US); Todd Sharpe, Austin, TX (US); Shyh-Nung Steve Lin, Austin, TX (US); Hongyun Wang, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/432,835

(22) Filed: Nov. 3, 1999

(51) Int. Cl.[7] .............................. B08B 3/12; B44C 1/22
(52) U.S. Cl. .................. 134/122 R; 134/63; 134/64 R; 216/83; 216/103
(58) Field of Search ..................... 216/83, 100, 102, 216/103; 156/345; 134/122 R, 63, 64 R; 427/309

(56) References Cited

U.S. PATENT DOCUMENTS

| | | | |
|---|---|---|---|
| 3,661,660 A | * 5/1972 | Wessells et al. | 156/14 |
| 4,167,424 A | 9/1979 | Jubenville et al. | 134/1 |
| 4,555,302 A | * 11/1985 | Urbanik | 156/637 |
| 5,091,046 A | * 2/1992 | Hunter et al. | 156/642 |
| 5,330,558 A | 7/1994 | McCormick et al. | 75/715 |
| 5,441,062 A | * 8/1995 | Nogues | 134/122 R |
| 5,600,081 A | 2/1997 | Simjian | 84/453 |
| 5,776,265 A | 7/1998 | Kramer et al. | 148/241 |
| 5,863,343 A | * 1/1999 | Campbell | 134/1 |
| 5,865,199 A | 2/1999 | Pedziwiatr et al. | 134/184 |

FOREIGN PATENT DOCUMENTS

| | | |
|---|---|---|
| JP | 61139696 | 6/1986 |
| JP | 2104682 | 4/1990 |
| WO | WO 9311996 | 6/1993 |

OTHER PUBLICATIONS

"The Precision Cleaning of Delicate Structures Using Aggressive Ultrasonics Without Damage," *Precision Cleaning*, Russell C. Manchester, vol. V. No. 4, Apr. 1997.
"Ultrasonic Deburring," *Int. J. Adv. Manuf. Technol.*, S.H. Yeo et al. (1997) 13:333–341, (No month).
Cotell et al., "Ultrasonic Cleaning," *ASM Handbook*, 5:44–47, 1994.

* cited by examiner

Primary Examiner—Gregory Mills
Assistant Examiner—P. Hassanzadeh
(74) Attorney, Agent, or Firm—Moser Patterson Sheridan

(57) ABSTRACT

The present invention provides an improved finishing process and apparatus. In one embodiment, a method and apparatus are provided for finishing a metal article. The method includes cavitationally eroding the metal article to form pits in its external surface. The metal article is also corroded with a corrosion chemical to corrode the pitted metallic surface. In this manner, substantially homogeneously distributed micro-pits can be formed about the article to create a desired matte finish, as well as a surface that is amenable for sealing. In a preferred embodiment, the corrosion chemical is part of a finishing bath that is ultrasonically cavitated for eroding the metal article.

28 Claims, 6 Drawing Sheets ic Metal Finishing

TECHNICAL FIELD OF THE INVENTION

This invention relates to the field of metal surface finishing and in particular to the process of using ultrasonic cavitation to accomplish such finishing.

BACKGROUND OF THE INVENTION

Within numerous manufacturing industries, metal components such as those composed of aluminum can require various finishing processes. In the semiconductor tooling industry, two of these finishing processes for aluminum tools include (1) "jitterbugging" for applying a suitable cosmetic appearance to exposed aluminum surfaces, and (2) polishing for adequately smoothing a surface to provide it with sufficient sealing capability and to reduce its imperfections.

Jitterbugging a surface normally involves manually sanding the surface with vibratory sanding in conjunction with bonded abrasive grain media or fiber pads. This creates a desired dull "matte" finish. In the semiconductor tooling industry, this jitterbug finish has generally become somewhat of an industry standard for exposed aluminum surfaces.

Unfortunately, because the surfaces are processed manually, the required quality of jitterbug finishing is difficult to define, document, or repeat. In addition, excessive human resources are required for jitterbugging the surface of a conventional tool.

Moreover, while the jitterbugged surfaces appear to be cosmetically uniform due to their diffusive appearance, a typical surface without any additional polishing will include lengthy, continuous traces resulting from the use of abrasive materials. These lengthy traces (or scratches) tend to impair the surface's sealing capability. Chemical cleaning can greatly improve the surface morphology, but it does not completely eliminate the traces. In addition, such chemical cleaning will not sufficiently reduce the surface's porosity. Thus, polishing is applied to portions of surfaces that require sealing capability or have porosity threshold requirements.

Polishing metal surfaces in order to improve their sealing capability also involves significant manual effort and resources. In addition, traditional polishing processes are not always effective for attaining necessary sealing capabilities. Moreover, some surfaces have complicated or intricate geometries that are not even amenable to conventional polishing.

Accordingly, a need exists for an improved process for finishing metallic surfaces.

SUMMARY OF THE INVENTION

The present invention provides such an improved finishing process and apparatus. In one embodiment, a method and apparatus are provided for finishing a metal article. The method includes cavitationally eroding the metal article to form pits in its external surface. The metal article is also corroded with a corrosion chemical to corrode the pitted metallic surface. In this manner, substantially homogeneously distributed micro-pits can be formed about the article to create a desired matte finish, as well as a surface that is amenable for sealing. In a preferred embodiment, the corrosion chemical is part of a finishing bath that is ultrasonically cavitated for eroding the metal article.

For a more complete understanding of the present invention, and the advantages thereof, reference is now made to the following descriptions taken in conjunction with the accompanying drawings, in which:

FIG. 1 shows a block diagram of one embodiment of an apparatus for finishing a metal article pursuant to the present invention.

DETAILED DESCRIPTION

Figure 1A:
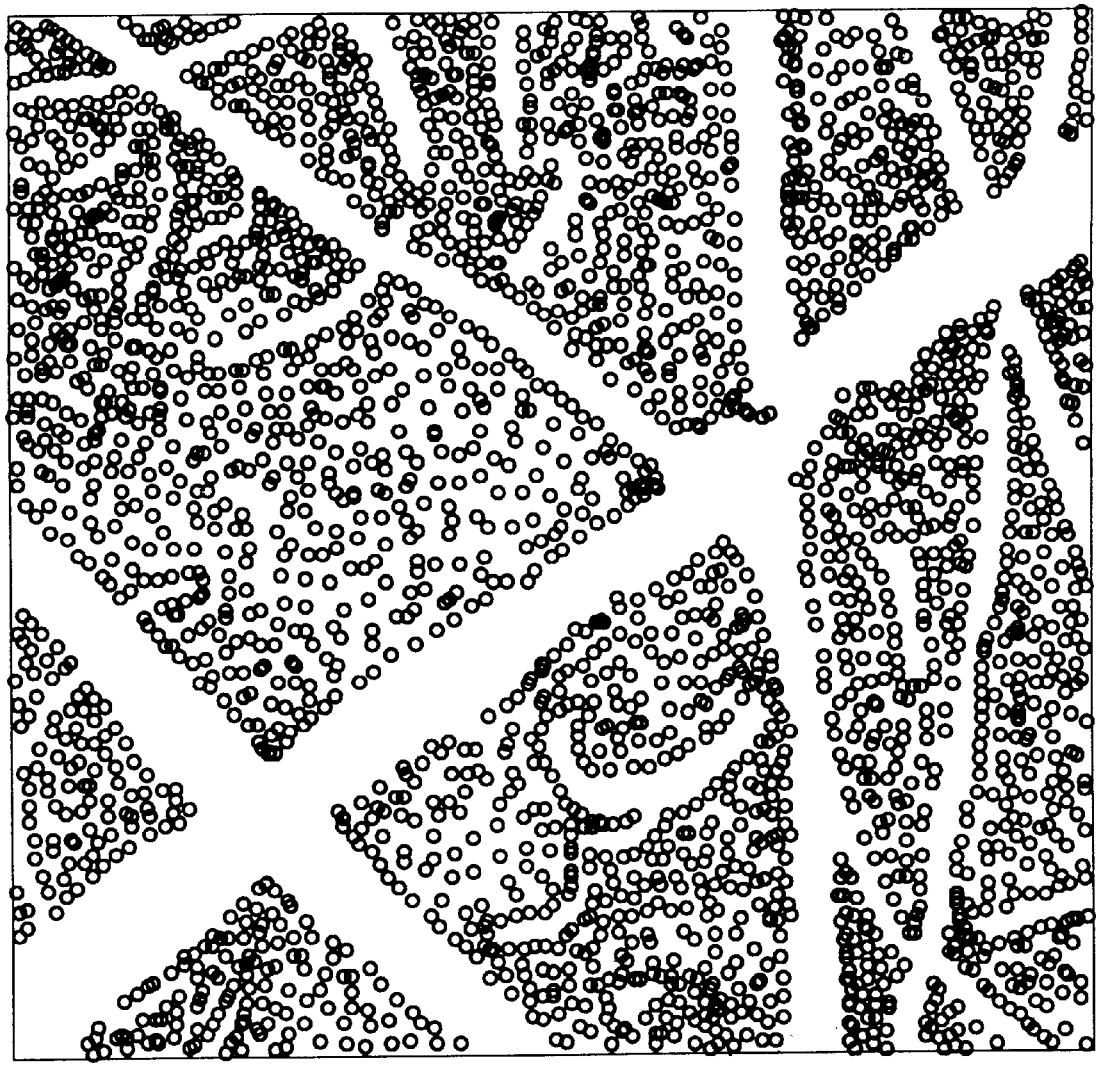
FIGS. 1A and 1B show magnified aluminum surfaces after having been finished pursuant to a prior art Jitterbug process.
Figure 1B:
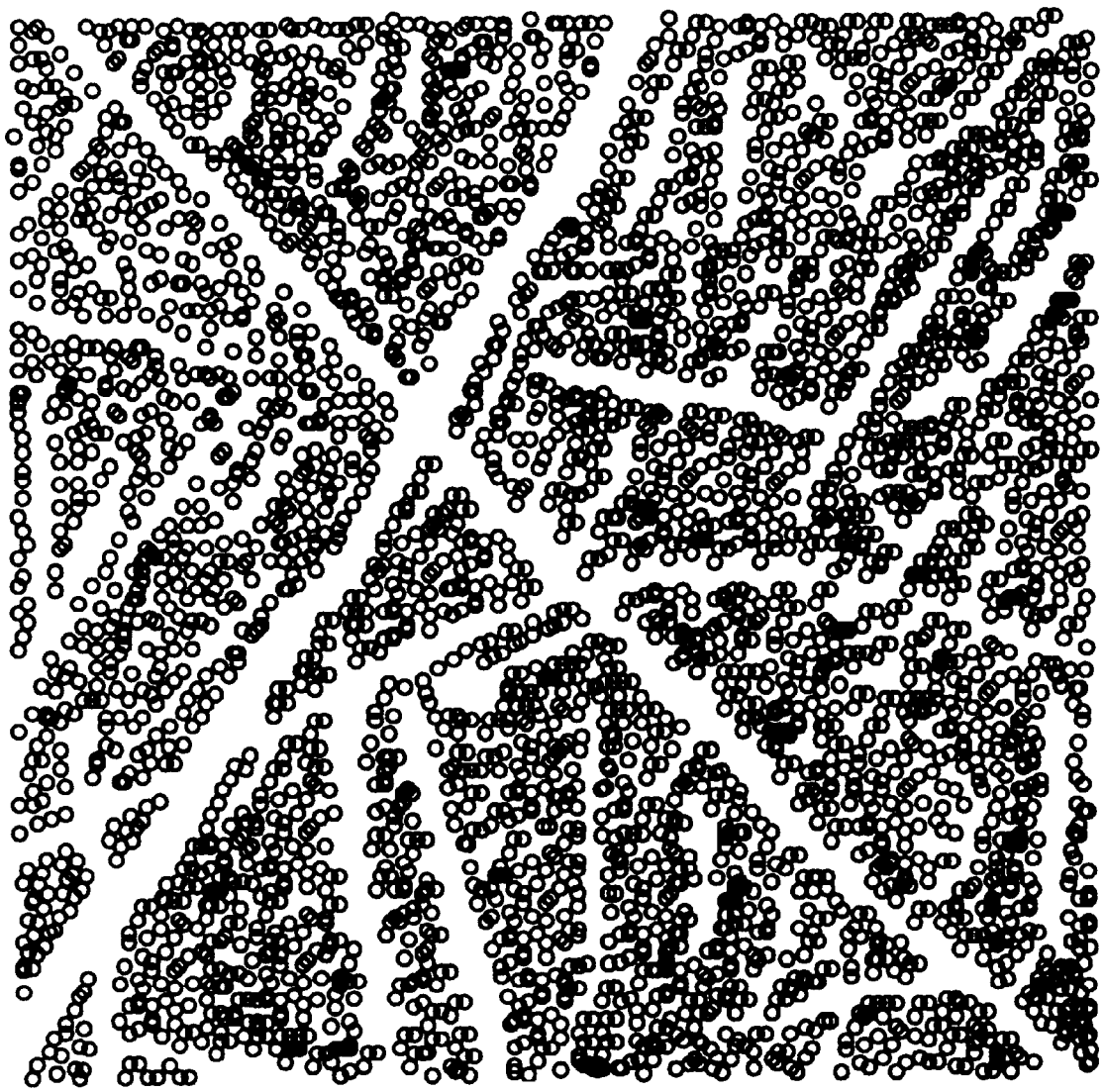

The present invention provides a finishing scheme that involves cavitationally eroding and chemically corroding a metal article within a finishing bath. In one embodiment, the corrosion is enhanced with ultrasonic cavitation of the chemical solution within the finishing bath. Micro pits are initially formed in the exposed passivation layer about the surface of the article. The pits are then enlarged and smoothed through chemical corrosion.

A. Finishing Process

In general, all metal surfaces are covered with a thin layer of natural oxides through a process typically termed as natural passivation. For example, with Al and its alloys, this passivation layer is typically composed of hydroxide and oxide, which are quite inert in alkaline environments. Aluminum typically has a thin (e.g., about 10 nm) oxide layer on its surface whenever it has been exposed to the atmosphere. This passivation layer, which is mainly composed of $Al_2O_3$, prevents further oxidation of the underlying bulk aluminum.

With the present invention, a metal article to be finished is placed in a finishing solution in the presence of an ultrasonic field with sufficient energy levels for adequate cavitation. The cavitation creates micro pits that penetrate through the passivation layer to the underlying substrate (metal surface). Once pits are created and substrate portions are exposed, corrosion of the underlying metal proceeds with chemical reaction(s) between exposed metal and a corroding chemical such as a caustic or alkaline solution. The pits are enlarged with the continuation of corrosion reaction. This cavitation/enhanced corrosion finishing process creates the desired "matte" appearance. In addition, because the pits are randomly distributed over the surface of the article, a sufficiently homogeneously "smooth" surface results with favorable porosity and sealing characteristics.

1. Cavitation

The formation of micro pits in the passivation layer is achieved by cavitation erosion with the use of ultrasonic energy. Cavitation is the formation and collapse of bubble-like voids or vapor bubbles in a liquid subjected to rapid pressure changes, which are created with activation of ultrasonic waves. The bubbles are created at sites of rarefaction as liquid fractures or tears because of the negative pressure of the ultrasound wave traveling in the liquid. When cavities implode immediately on the solid passivation surface or at least in their close proximity, erosion of the surface occurs.

The efficiency of cavitation can be enhanced in various manners. Higher power density waves provide stronger shock waves for the generation of high speed jets (e.g., 100 m/s), which create the micro pits in the passivation surface. In addition, the use of higher frequency waves leads to a higher threshold for cavitation. As a consequence, it requires more energy to produce the cavities of similar sizes. Degassing the liquid decreases the threshold by limiting excessive solution of gas, which otherwise would diffuse into the cavitation bubbles and retard rapid collapsing of cavities. This further accelerates the cavitational erosion process. Other parameters besides power density and frequency that affect the efficiency of cavitation include: finishing solution temperature (viscosity and surface tension of finishing solution) and surface morphology/roughness prior to processing.

Because a random cavitation distribution over the article's outer surface is desirable, frequency sweeping of the generated ultrasonic field may be employed to avoid the problems created with standing waves in a finishing tank. In addition, when finishing articles with difficult geometries, the ultrasonic wave source's position and/or that of the article and wave-source relative to one another may be modified in order to achieve acceptable uniformity.

2. Corrosion

The corrosion process will briefly be described with aluminum as the metal article and the use of an alkaline solution as the chemical corrosive; however, skilled artisans will recognize that the same fundamental principles would apply for other metals and other corrosives with similar chemical relationships with one another. Initially, $OH^-$ is adsorbed at the exposed (penetrated) Al surfaces. Aluminate (i.e., $Al+4OH^{31}$, which results in $Al(OH)_4^-+3e^-$) is then formed. This may be the slowest part of the whole chemical reaction.

The corrosion process (and thus ultimately the finishing process itself) is affected and may be enhanced by optimizing (as a matter of taste for a given application) the following factors: pH level of corrosive (e.g., of alkaline solution), chemical composition of corrosive solution (accounting for enhancing additives, as well as contaminant inclusions or particles); temperature; and processing time. Specifically, the process may be enhanced by (1) removing reaction product while corrosion is occurring, (2) substantially maintaining the pH of the corrosive solution at a desired level, and (3) corroding the metal substrate in an ultrasonically energized environment (e.g., during ultrasonic cavitation with the finishing solution functioning as both the cavitation median and the chemical corrosive).

Corroding the metal while being subjected to ultrasonic energy enhances the corrosion process for several reasons. Ultrasonic cavitation facilitates the generation of fresh aluminum surface permitting the chemical reaction to expand. In addition, ultrasonic cavitation provides thermal energy, which accelerates the chemical reaction and may even change the reaction path. Furthermore, ultrasonic cavitation circulates the liquid so as to achieve a uniform chemical reaction. Finally, along with the ultrasonic cavitation and implosion that happens at close proximity to the surface resulting in noticeable material removal, there are implosions near the surface and throughout the liquid. These disturbances effectively substitute "fresh"(more chemically active) finishing solution for solution that is saturated with chemical reactant products and is relatively depleted of chemical agents for reacting with the aluminum. This allows the more chemically active solution to come into contact with the aluminum surface so as to permit the chemical reaction to continue until the chemical corrosion solution (e.g., finishing solution) is evenly saturated everywhere. This is especially beneficial when irregular surfaces or internal passageways are to be finished.

B. Ultrasonic Finishing Apparatus

Figure 2:
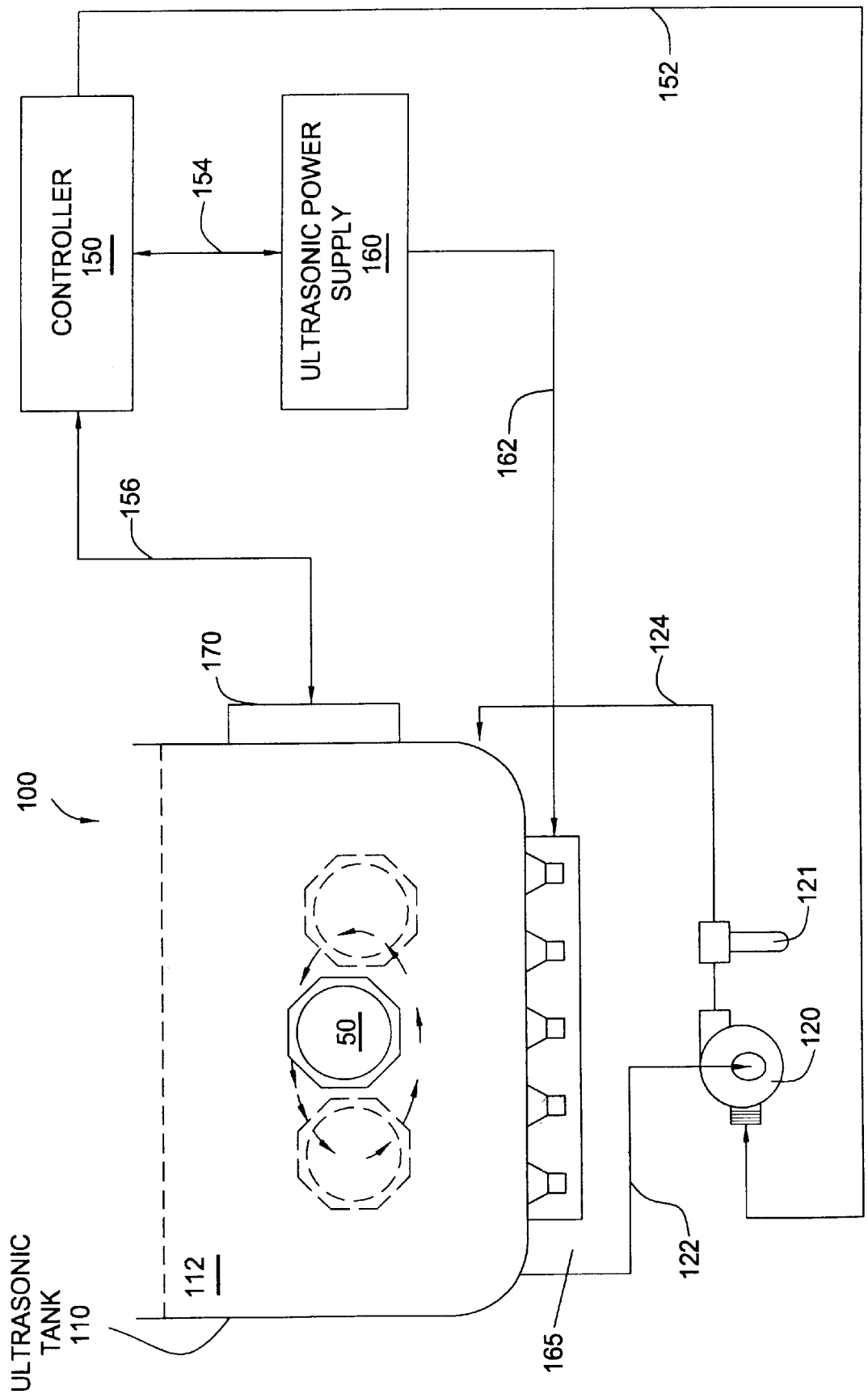
Figure 3A:
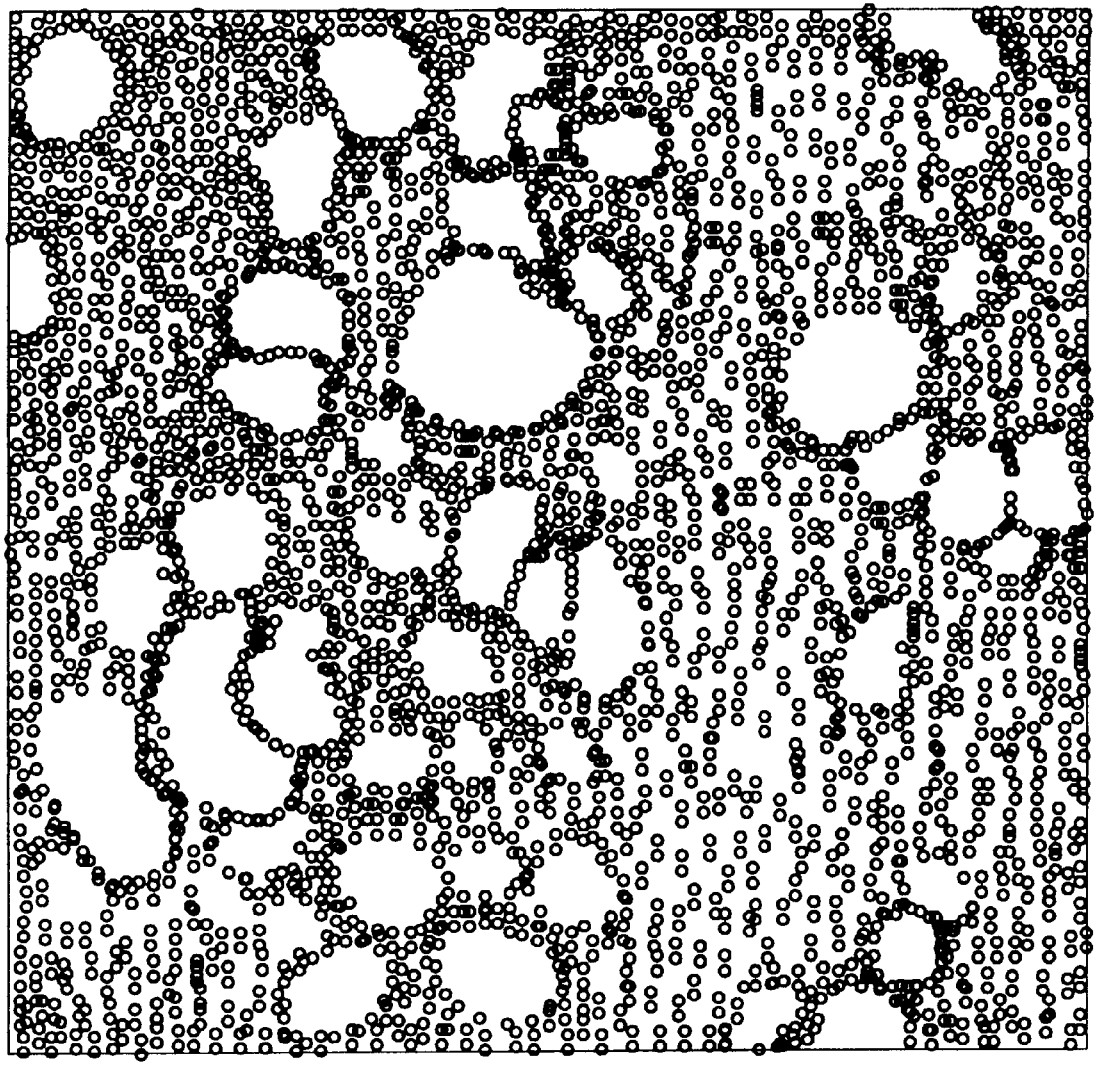
FIGS. 3A–3C show magnified views of aluminum surfaces after having been finished pursuant to one embodiment of the present invention.
Figure 3B:
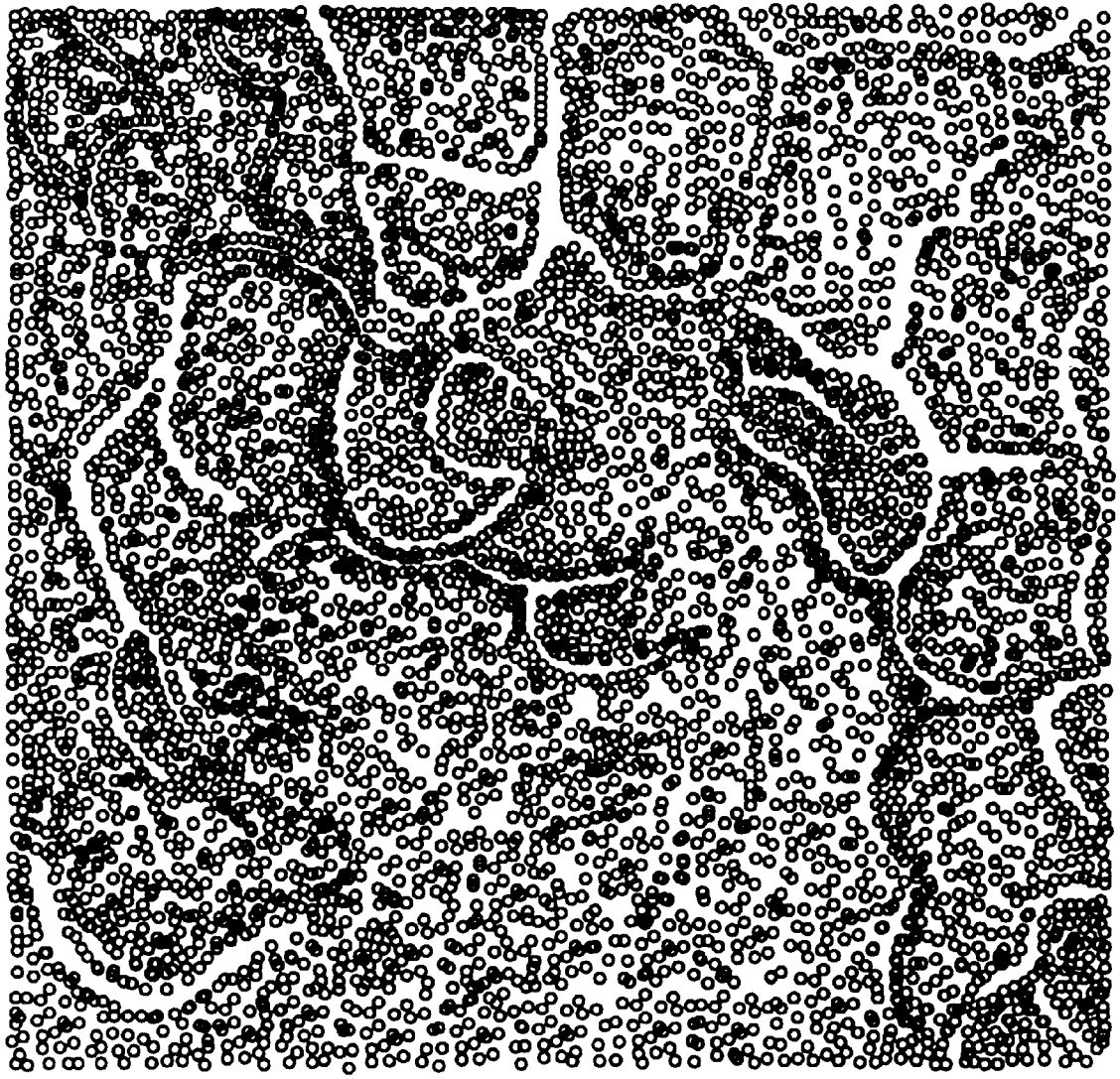
Figure 3C:
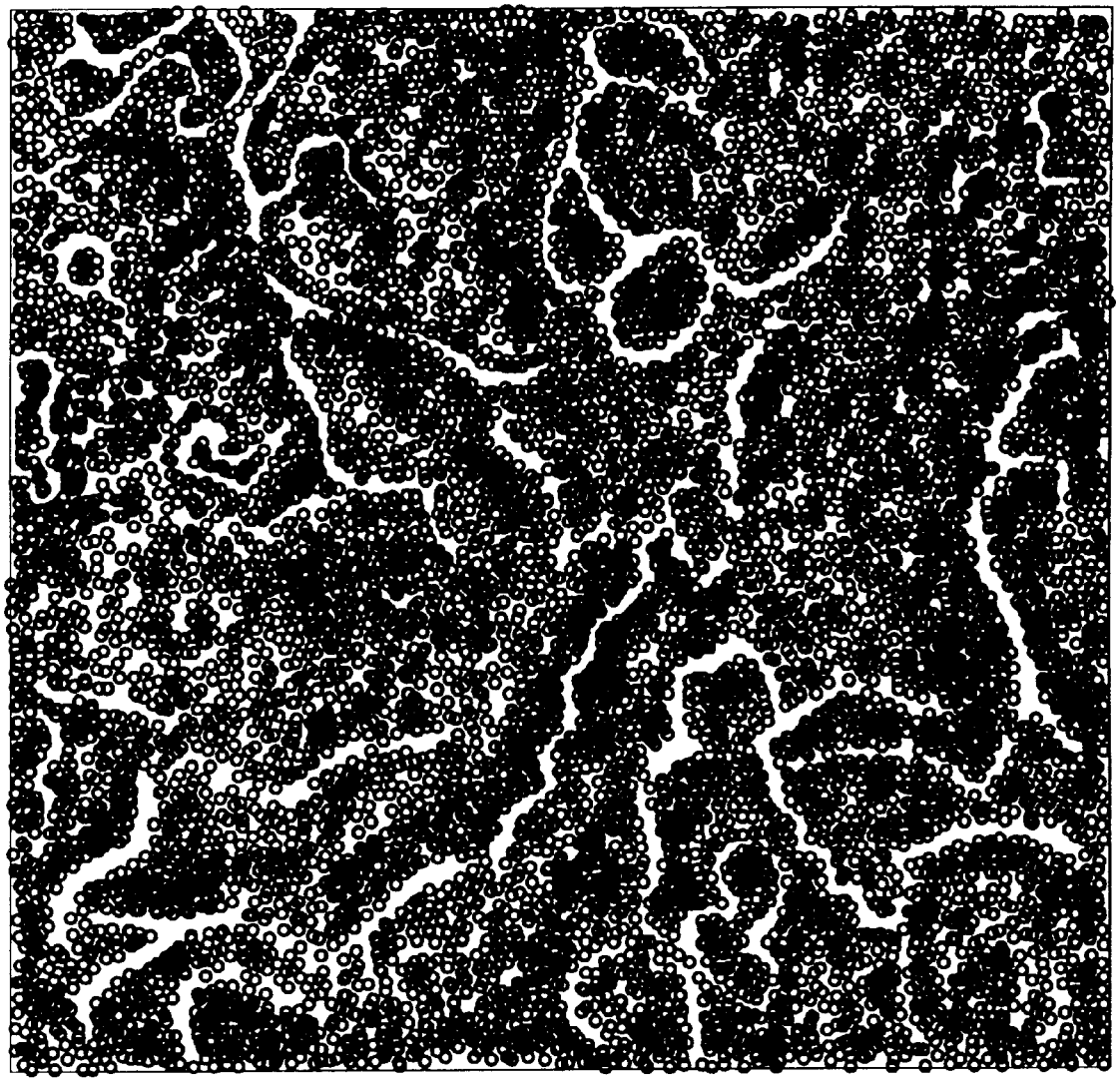

FIG. 2 shows an apparatus 100 for finishing a metal article 50 (e.g., an aluminum tool) with a process of the present invention. The apparatus 100 includes tank 110, which contains finishing solution 112 that, in the depicted embodiment, is chemically corrosive and also serves as the cavitation liquid. Also included is recirculation pump 120, controller 150, ultrasonic power supply 160, ultrasonic transducers (e.g., bonded, immersible) 165, and environmental control module 170.

Recirculation pump 120 is fluidly connected in a closed loop configuration to tank 110 via tank outflow and inflow lines 122, 124, respectively. The ultrasonic power supply 160 is electrically connected through line 162 to ultrasonic transducers 165, which are operably mounted to tank 110 for generating ultrasonic waves within the finishing solution 112. Likewise, environmental control module 170 is also operably mounted to tank 110 for controlling various environmental parameters (e.g., temperature, fluid level, chemical pH) of finishing solution 112. Controller 150 is communicatively connected to recirculation pump 120, ultrasonic power supply 160, and environmental control module 170 via communication links 152, 154, and 156, respectively.

The ultrasonic power supply 160 generates an electrical signal having a controllably adjustable frequency, responsive to controller 150, for ultrasonically driving the ultrasonic transducers 165. The environmental control module includes appropriate sensors, transducers, and/or other devices for controlling, responsive to controller 150, relevant environmental parameters within finishing solution 112. Finally, responsive to control from controller 150, recirculation pump 120 recirculates finishing solution 112 through a filter 121 for filtering the finishing solution in order to controllably limit the accumulation of particulate matter such as abrasive particles.

The components for implementing apparatus 100 may be implemented with any suitable devices and are conventionally known to persons having ordinary skill in the art. Likewise, the finishing solution 112 may be any solution that promotes adequate cavitation in connection with apparatus 100. As known in the art, almost any liquid will meet this requirement. In one embodiment, finishing solution 112 includes the chemical corrosive for chemically corroding the metal as the article is being subjected to cavitation. For example, with aluminum as the article, an alkaline solution could be used as the finishing solution. One example of a suitable finishing solution for Aluminum articles is Al-Tex 101™, available from ACS Products of Plainville, Mass. Al-Tex 101™ is an alkaline cleaner concentrate with a pH value in the range of about 13 to 13.5. The actual composition of Al-Tex 101™, in percentage proportions by weight, is as follows: Deionized water (65%), Potassium Hydroxide (25%), Sodium Gluconate (4%), NTA Chelator [Nitrilo-Tri-Acetic Acid] (1%), Pluronic® L-62LF [surfactant] (1%), Triton® H-66 [stabilizing agent] (4%).

When the finishing solution includes the chemical corrosive, selection of the particular finishing solution composition should be guided by the selectivity between the passivation layer and metal substrate. The chemical should be relatively more aggressive for substrate than for passivation layer. In addition, additives can be formulated to enhance the ability for removing contaminant inclusions (e.g., silicon, iron), which can remain in the finished metal surface.

In the depicted embodiment, controller 150 controls the overall operation of apparatus 100 in accordance with instructions from a user. The controller 150 is programmed (or adjusted) so that the apparatus 100 finishes the metal article 50 according to a particularly desired finishing process. Controller 150 controls the operation of recirculation pump 120 to adjust or maintain the concentration of particulate matter (which may be created pursuant to the finishing process) in the finishing solution 112. In addition, controller 150 through environmental control module 170 controls various finishing solution 112 parameters including temperature, chemical pH level, and volume. Controller 150 also controls ultrasonic power supply 160 for controllably generating ultrasonic waves within the finishing solution 112. The generated wave frequency may be adjusted or even continuously varied such as by sweeping the generated frequency over a preselected frequency range. In this manner, controller 150 controls the various relevant processing factors such as ultrasonic wave characteristics, timing, and the physical and chemical properties of the finishing solution 112 in order to carry out the finishing process.

C. Example

A number of 11.5" by 5" by 0.75" aluminum plates were machined from commercial grade 6061 T6 Al alloy. Each batch of plates was processed in an ultrasonic tank of finishing solution composed of diluted, commercially available alkaline cleaner at temperatures of between 60 to 80° C. The bath was subjected to an ultrasonic field with a frequency in the range of 23 to 27 kHz and a power density in a range of between 100–120 watts—per gal. Typically, it took about thirty minutes to achieve a diffusive or matte appearance. After processing, all Al plates were rinsed to clean off the finishing solution. The three batches of Al plates were processed under slightly different conditions due mainly to different processing times and the use of finishing solutions with slightly different levels of alkalinity.

Surface morphology differences were observed in the three batches. Depending on the finishing bath alkalinity (as well as on the other processing parameters) pit number, size, and consistency varies from one batch to another. For plates processed in the first batch in a weaker alkaline solution, the surfaces exhibited smaller diameter pits with stepped grain boundaries. For plates processed in the second batch, the surfaces exhibited overlapping pits of various diameters. In addition, it appears that smaller pits were produced at the surfaces of larger pits previously produced. Finally, for plates processed in the third batch in the strongest alkaline solution, the surfaces exhibited similar distributions of pits and small portion of surfaces without any pits. On a sufficiently macroscopic level, these overlapping pits are homogeneous enough to not only create the desired matte finish, but also, to create a suitably sealable surface.

D. Other Embodiments

It should be understood that various changes, substitutions and alterations can be made herein without departing from the spirit and scope of the invention as defined by the appended claims.

An additional act of cleaning the metal article may be performed after it has been cavitated and corroded to remove inclusions and other particles that do not react with the chemical corrosive. With aluminum articles and an alkaline corrosive used for the corroding process, the presence of inclusions and particles on the surface results from the lack of chemical activity of embedded contaminants that are not reactive in alkaline environments. Some of these inclusions include silicon and magnesium, probably in the form of magnesium silicide, which is a common second phase constituent in commercial grade 6061 Al alloys. Some other inclusions included ferric aluminum compounds. These inclusions and particles are detrimental to the cleanliness of internal surfaces of components exposed, e.g., to wafer transfer and processing environments in semiconductor manufacturing applications. Two methods, chemical and $CO_2$ pellet cleaning, were examined in an attempt to remove inclusions and particles. It appears that $CO_2$ pellet cleaning is less effective. This is probably due to the fact that embedded inclusions normally cannot be readily removed by mechanical means. However, it was discovered that chemical cleaning with a conventional metal cleaning solution was effective for removing these inclusions.

In addition, it should be noted that although the description above primarily describes the treatment of aluminum articles, the process can be applicable to a wide range of metals and other materials.

E. Remarks

The present invention provides a more efficient and cost effective process for finishing metal parts. In addition, it provides a finishing process that will produce a more even finish of the part than the Jitterbug process, which can result in variation from one area on the part to another. Moreover, it produces a random pattern of erosion after finishing in contrast to the unfavorable geometric patterns, which result from the Jitterbug process. The finishing process of the present invention improve the sealing characteristics, along with the surface porosity of its finished metal surfaces, which reduces and even eliminates the need for polishing.

Furthermore, with the present invention, parts are processed more rapidly and less expensively than using prior art methods. A further advantage of the present invention is that exposure in the agitated fluid bath, which produces the erosion effect, is uniform about the surface regardless of its complexity or intricacy.

We claim as follows:

1. A method for finishing an article having an external passivation surface and an underlying metal interior, the method comprising:
    (a) cavitationally eroding the article to form micro-pits on its external passivation surface, wherein a plurality of the pits penetrate into the underlying metal interior; and
    (b) corroding the pitted surface with a corrosion chemical to enlarge the pits in the underlying metal interior, wherein the article comprises a metallic surface with a plurality of randomly distributed micro-pits, wherein the metallic surface is suitable for sealing.

2. The method of claim 1, wherein the act of cavitationally eroding the metal article includes cavitationally eroding the article in a finishing bath that is being ultrasonically cavitated.

3. The method of claim 2, wherein the act of corroding includes corroding the pitted metallic surface in the finishing bath while it is being ultrasonically cavitated.

4. The method of claim 3, wherein the act of corroding the pitted metallic surface includes the act of corroding the pitted metallic surface with an alkaline solution.

5. The method of claim 4, wherein the alkaline solution has an initial pH value, the method further comprising the act of maintaining substantially constant the initial pH value.

6. The method of claim 5, further comprising the act of limiting the amount of accumulating abrasive particulate within the finishing bath.

7. The method of claim 2, wherein the act of corroding includes corroding the pitted metallic surface in the finishing bath after the article has been ultrasonically cavitated.

8. The method of claim 1, wherein ultrasonically cavitating the finishing bath includes the act of ultrasonically agitating the finishing bath at a primary frequency within 20–150/kHz.

9. The method of claim 8, wherein the act of ultrasonically cavitating includes the act of varying the agitation frequency over a predetermined range about the primary frequency.

10. The method of claim 1, further comprising the act of cleaning the article.

11. The method of claim 10, wherein the act of cleaning includes the act of cleaning the article with a metallic cleaner after the article has been eroded and corroded, wherein contaminant inclusions are removed from the article.

12. A method of finishing a metal article having a passivation layer and an underlying metallic surface, the method comprising:

(a) depositing the article in a finishing bath;

(b) ultrasonically cavitating the bath, wherein pits are formed in the passivation layer with a plurality of the pits penetrating to the metallic surface; and (c) corroding the penetrated metallic surface with a corrosion chemical, to enlarge the pits in the metallic surface, wherein the metallic surface acquires substantially homogeneously distributed micro pits resulting in a matte appearance.

13. The method of claim 12, wherein the act of corroding the penetrated metallic surface includes ultrasonically cavitating the finishing bath, which includes the corrosion chemical.

14. The method of claim 13, wherein the act of corroding the penetrated metallic surface includes corroding the penetrated metallic surface with an alkaline finishing bath.

15. The method of claim 14, wherein the alkaline finishing bath has an initial pH value, the method further comprising maintaining substantially constant the initial pH value.

16. The method of claim 15, further comprising the act of limiting the amount of accumulating abrasive particulate within the finishing bath.

17. The method of claim 12, wherein the act of ultrasonically cavitating includes the act of ultrasonically agitating the finishing bath at a primary frequency within a range of 20–150/kHz.

18. The method of claim 17, wherein the act of ultrasonically finishing includes the act of varying the agitation frequency over a predetermined range about the primary frequency.

19. The method of claim 12, further comprising the act of cleaning the article.

20. The method of claim 19, wherein the act of cleaning includes cleaning the article with a metallic cleaner after the article has been corroded.

21. A process for finishing a part having an external passivation surface and an underlying metal interior, comprising:

(a) preparing a fluid bath in a container, wherein said fluid is chemically active with the underlying metal interior;

(b) depositing the part in the fluid bath;

(c) agitating the fluid at one or more preselected frequencies; and (d) continuing said agitation for an established process duration, wherein the part's surface acquires randomly distributed micro pits, most of which penetrate into the underlying metal interior resulting in the external surface having a matte appearance and being suitable for sealing.

22. The process of claim 21, wherein the fluid is an alkaline solution, the process further comprising the act of adjusting the fluid composition to substantially maintain it at a substantially constant alkalinity.

23. The process of claim 22 wherein the act of preparing comprises maintaining the temperature of the bath at between 30–70° C. for the duration of the process.

24. The process of claim 23, wherein the act of continuing comprises continuing the process for a duration of between 25 and 35 minutes.

25. The process of claim 24, wherein the act of agitating comprises agitating at a core frequency of between 20 KHz and 30 KHz.

26. The process of claim 25, wherein the act of agitating comprises agitating at a core frequency of 25 KHz.

27. The process of claim 23, wherein the act of continuing comprises continuing the process for a duration of approximately 30 minutes.

28. The process of claim 22 wherein the act of preparing comprises substantially maintaining the temperature of the bath at 50 degrees Celsius for the duration of the process.

* * * * *

UNITED STATES PATENT AND TRADEMARK OFFICE
CERTIFICATE OF CORRECTION

PATENT NO.    : 6,481,449 B1
DATED         : November 19, 2002
INVENTOR(S)   : Russell Manchester et al.

It is certified that error appears in the above-identified patent and that said Letters Patent is hereby corrected as shown below:

Column 3,
Line 28, should read "(i.e., $Al + 4OH^-$, which results in $Al(OH)_4^- + 3e^-$) is then".

Signed and Sealed this

Tenth Day of August, 2004

JON W. DUDAS
*Acting Director of the United States Patent and Trademark Office*